(12) United States Patent
Hong et al.

(10) Patent No.: US 12,550,259 B2
(45) Date of Patent: Feb. 10, 2026

(54) ELECTRICALLY COUPLING PRINTED CIRCUIT BOARDS USING A SNAP-FIT CONNECTOR

(71) Applicant: Sandisk Technologies, Inc., Milpitas, CA (US)

(72) Inventors: Tew Wei Hong, Penang (MY); Beng Gian Ooi, Penang (MY); Fu Xing Chan, Penang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 230 days.

(21) Appl. No.: 18/361,037

(22) Filed: Jul. 28, 2023

(65) Prior Publication Data

US 2024/0397624 A1    Nov. 28, 2024

Related U.S. Application Data (60) Provisional application No. 63/504,242, filed on May 25, 2023.

(51) Int. Cl.
*H05K 1/14* (2006.01)
*H05K 1/11* (2006.01)
*H05K 1/16* (2006.01)

(52) U.S. Cl.
CPC ............. *H05K 1/142* (2013.01); *H05K 1/111* (2013.01); *H05K 1/117* (2013.01); *H05K 1/162* (2013.01); *H05K 2201/048* (2013.01); *H05K 2201/10159* (2013.01); *H05K 2201/10984* (2013.01)

(58) Field of Classification Search
CPC .......... H05K 1/142; H05K 1/11; H05K 1/117; H05K 1/162; H05K 2201/048
USPC ........................................................ 174/250
See application file for complete search history.

(56) References Cited

U.S. PATENT DOCUMENTS

| | | | | |
|---|---|---|---|---|
| 6,144,721 | A  * | 11/2000 | Stephens | H04M 3/308 |
| | | | | 379/22.03 |
| 10,304,716 | B1 * | 5/2019 | Chung | H01L 23/49827 |
| 2016/0338191 | A1 * | 11/2016 | Tanaka | H05K 3/0047 |
| 2020/0080716 | A1 * | 3/2020 | Mertens | H05K 1/0203 |
| 2020/0214151 | A1 * | 7/2020 | Su | H05K 5/0069 |
| 2021/0119361 | A1 * | 4/2021 | Perry | H01R 12/7047 |

FOREIGN PATENT DOCUMENTS

WO    WO-2018063412 A1 *   4/2018   ........... H01R 12/716

* cited by examiner

*Primary Examiner* — Andargie M Aychillhum
(74) *Attorney, Agent, or Firm* — DENTONS Durham Jones Pinegar (57) ABSTRACT

A snap-fit connector electrically and mechanically couples a first circuit board to a second circuit board. A first portion of the snap-fit connector is positioned on or within the first circuit board. The first portion of the snap-fit connector is electrically coupled to a trace associated with an electronic component on the first circuit board. A through-hole defined by the second circuit board is removably coupled to a top portion of the snap-fit connector. The through-hole on the second circuit board is electrically coupled to a trace of an electronic component provided on the second circuit board. Thus, the snap-fit connector electrically couples the electronic component on the first circuit board with the electronic component on the second circuit board.

20 Claims, 9 Drawing Sheets

ELECTRICALLY COUPLING PRINTED CIRCUIT BOARDS USING A SNAP-FIT CONNECTOR

CROSS-REFERENCE TO RELATED APPLICATIONS

The present application claims priority to U.S. Provisional Application 63/504,242 entitled "ELECTRICALLY COUPLING PRINTED CIRCUIT BOARDS USING A SNAP-FIT CONNECTOR", filed May 25, 2023, the entire disclosure of which is hereby incorporated by reference in its entirety.

BACKGROUND

In some circuit board designs, a daughterboard is used to augment or extend the capabilities of a motherboard. For example, a first set of electronic components (e.g., memory devices, controllers) may be provided on the motherboard while a second set of electronic components (e.g., capacitors) are provided on the daughterboard. The daughterboard is typically connected to the motherboard using a connector, such as a pin connector.

In order to reduce a Z-height of the connected motherboard and daughterboard, the connector may be miniaturized. However, as the connector gets smaller, the ability of the connector to maintain a stable connection between the daughterboard and the motherboard is reduced.

Additionally, a male portion of the connector is typically placed on an edge of the daughterboard while a female portion of the connector is typically placed on an edge of the motherboard. The placement of each connector, in addition to the reduced size of the connector, may cause the daughterboard to slant upward or downward with respect to the motherboard. The slanting effect may also reduce the reliability of the connection between the daughterboard and the motherboard.

Accordingly, it would be beneficial to have a connector that can reliably connect a daughterboard to a motherboard while minimizing a Z-height of the connected daughterboard and motherboard.

SUMMARY

The present application describes a snap-fit connector for printed circuit boards (PCBs). In an example, the snap-fit connector may be used to removably couple a daughterboard to a motherboard. In addition to connecting the daughterboard to the motherboard, the snap-fit connector also provides an electrical connection between electronic components on the motherboard and electronic components on the daughterboard.

For example, a standoff portion of the snap-fit connector may be electrically coupled to a trace associated with an electronic component on the daughterboard. Additionally, a through-hole provided on the motherboard may be removably coupled to a top portion of the snap-fit connector. The through-hole on the motherboard is also electrically connected to a trace of an electronic component provided on the motherboard. Accordingly, the snap-fit connector may be used to provide an electrical connection between electronic components on the daughterboard with electronic components on the motherboard. In addition, the snap-fit connector provides a secure mechanical connection between the motherboard and the daughterboard.

Accordingly, the present application describes an electronic assembly that includes a first circuit board and a second circuit board. A first electronic component is electrically coupled to a through-hole defined by the first circuit board and a second electronic component is electrically coupled to a through-hole defined by the second circuit board. A snap-fit connector has a first portion that is provided within the through-hole defined by the first circuit board and a second portion that is provided within the through-hole defined by the second circuit board. The snap-fit connector establishes an electrical connection between the first electronic component and the second electronic component.

The present application also describes an electronic assembly that includes a first circuit board and a second circuit board. A first electronic component is associated with the first circuit board. A first trace extends between the first electronic component and a connection point associated with the first circuit board. A second electronic component is associated with the second circuit board. A second trace extends between the second electronic component and a through-hole associated with the second circuit board. A snap-fit connector has a first portion that is electrically coupled to the connection point associated with the first circuit board and has a second portion provided within the through-hole associated with the second circuit board. The first portion of the snap-fit connector and the second portion of the snap-fit connector establish an electrical connection between the first electronic component associated with the first circuit board and the second electronic component associated with the second circuit board.

Also described is an electronic assembly having a first circuit board and a second circuit board. A first electronic component is associated with the first circuit board and a second electronic component is associated with the second circuit board. A first electrical conductor means extends between the first electronic component and a first connection means associated with the first circuit board. A second electrical conductor means extends between the second electronic component and a second connection means associated with the second circuit board. A connector means has a first portion that is electrically coupled to the first connection means associated with the first circuit board and a snap-fit means that is electrically coupled to the second connection means associated with the second circuit board.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

The present application describes a snap-fit connector for printed circuit boards (PCBs). In an example, the snap-fit connector removably couples a first circuit board (e.g., a daughterboard) to a second circuit board (e.g., a motherboard) (or vice versa). In an example, the snap-fit connector includes multiple portions or sections. For example, the snap-fit connector may include a first section (or a base section), a second section (or a standoff section), a third section (or a flanged section), and/or a fourth section (or a pronged section).

In an example, the snap-fit connector may be mounted in a through-hole defined by the first circuit board. For example, the second section (or the standoff section) may be inserted into the through-hole. In another example, the snap-fit connector may be mounted on a surface (e.g., to a bond pad or other connection point) of the first circuit board (e.g., using a reflow soldering process).

The fourth section the snap-fit connector may include prongs that are used to connect the second circuit board to the first circuit board. For example, a through-hole defined by the second circuit board may be pushed onto the prongs of the snap-fit connector. In response, the prongs may contract or bend toward a longitudinal axis of the snap-fit connector, which enables the through-hole on the second circuit board to be secured to the prongs. When the second circuit board has been connected to the snap-fit connector, the prongs return toward their original position, thereby securing the second circuit board to the first circuit board.

In addition to connecting the first circuit board to the second circuit board, the snap-fit connector also provides an electrical connection between electronic components on the first circuit board and electronic components on the second circuit board. Accordingly, the snap-fit connector may be made of an electrically conductive material.

For example, the second section of the snap-fit connector may be electrically coupled to a trace (or another electrical conductor) of an electronic component on the first circuit board. Additionally, the fourth section, or the prongs, of the snap-fit connector are connected to a trace (or another electrical conductor) of an electronic component on the second circuit board. Accordingly, the snap-fit connector may function as an electrically conductive bridge/connection between electronic components mounted on the first circuit board and electronic components mounted on the second circuit board.

In addition, the location/position of the snap-fit connectors on the first circuit board and/or the through-holes on the second circuit board may be used to increase the stability of the mechanical and electrical connection between the first circuit board and the second circuit board. For example, based on the position/location of the snap-fit connectors and the through-holes, a portion of the second circuit board may overlap with a portion of the first circuit board. The overlap may help prevent the first circuit board from slanting upward or downward relative to the second circuit board.

The snap-fit connector described herein may also reduce an overall Z-height of an electronic assembly that includes a first circuit board electronically connected to a second circuit board, especially when compared to a Z-height of an electronic assembly that includes a motherboard and daughterboard stacked together using use conventional pin connectors.

Accordingly, many technical benefits may be realized including, but not limited to, enabling motherboards to be removably coupled to daughterboards, ensuring stable electrical connections between electronic components on the daughterboard and electronic components on the motherboard, and reducing a Z-height of the stacked motherboard and daughterboard.

These and other examples will be shown and described in greater detail with respect to FIGS. 1-FIG. 7C.

Figure 1:
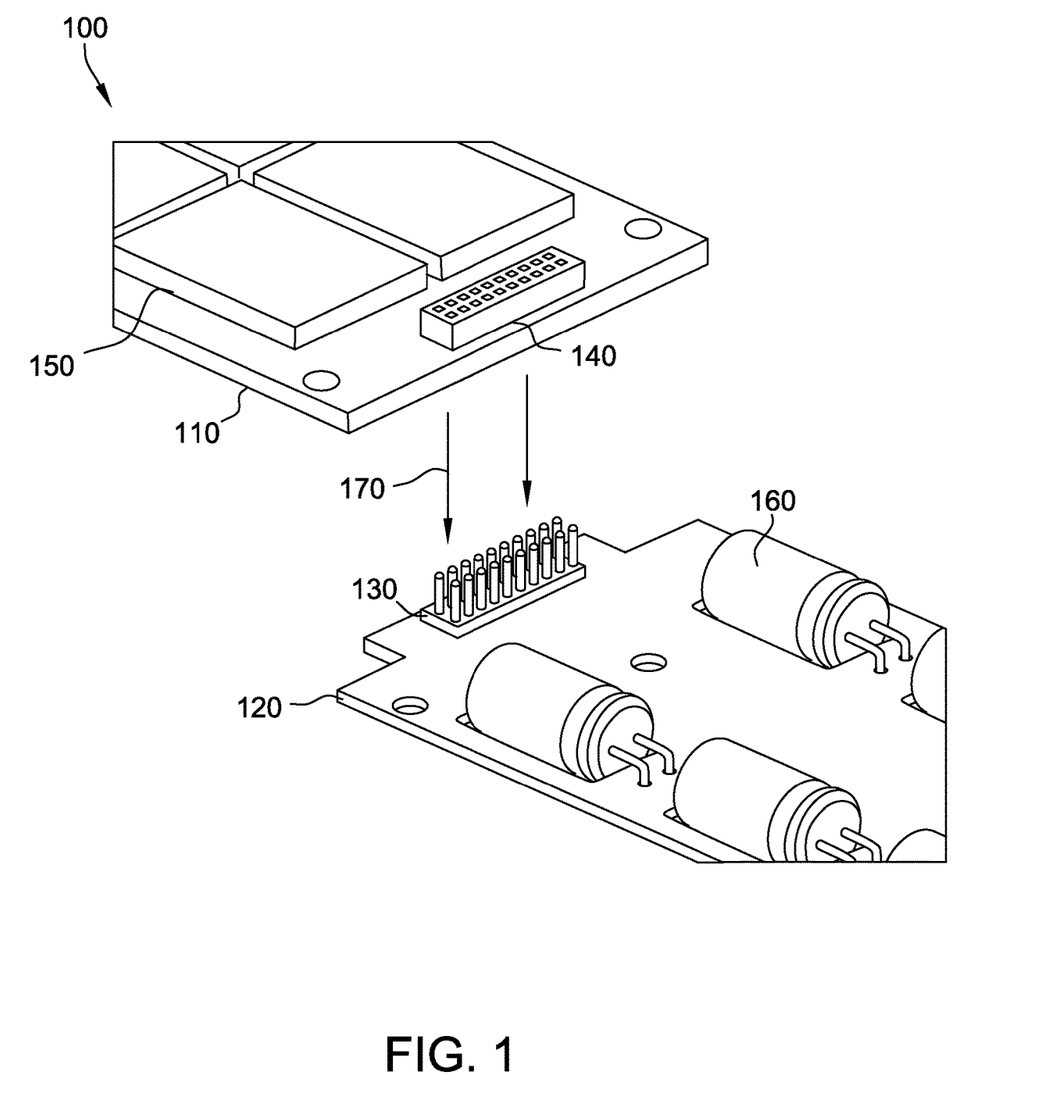
FIG. 1 illustrates an electronic assembly in which a motherboard is coupled to a daughterboard using a pin connector according to an example.

FIG. 1 illustrates an electronic assembly 100 in which a motherboard 110 is coupled to a daughterboard 120 using a pin connector 130 according to an example. In this example, the electronic assembly 100 may be a solid-state drive (SSD) or an enterprise solid-state drive (eSSD). As such, the motherboard 110 may include one or more memory devices 150 (e.g., NAND memory devices) 150 and/or other electronic components.

The motherboard 110 may also include a connector 140 (e.g., a female connector). In an example, the connector 140 of the motherboard 110 mates with the pin connector 130 (e.g., a male connector) on the daughterboard 120 as indicated by the arrows 170. The daughterboard 120 may also include one or more electronic components. In this example, the electronic components may be capacitors 160. The capacitors 160 store and discharge electrical energy and are used to provide backup power to the memory devices 150 or the other electronic components of the motherboard 110 in case of unexpected power outages and/or system failures.

In an example, the connector 140 of the motherboard 110 mates with the pin connector 130 of the daughterboard 120. When connected, the connector 140 and the connector 130 establish electrical connectivity between the memory devices 150 and the capacitors 160.

The pin connector 130 and/or the connector 140 may be miniaturized to reduce an overall Z-height of the electronic assembly 100. As one or more of the pin connector 130 and the connector 140 get smaller, the ability of the connectors to maintain a stable electrical connection between the daughterboard 120 and the motherboard 110 is reduced. As such, the capacitors 160 on the daughterboard 120 may not reliably receive power and/or provide power to the memory devices 150 in the event of a power failure or other failure.

Additionally, and as shown in FIG. 1, the pin connector 130 is placed on an edge of the daughterboard 120 and the connector 140 is placed near an edge of the motherboard 110. The placement of each connector, in addition to the reduced size of the connectors, may cause the daughterboard 120 to slant upward or downward with respect to the motherboard 110 when daughterboard 120 is coupled to the motherboard 110. The slanting effect may also reduce the reliability of the electrical connection between the daughterboard 120 and the motherboard 110.

Figure 2:
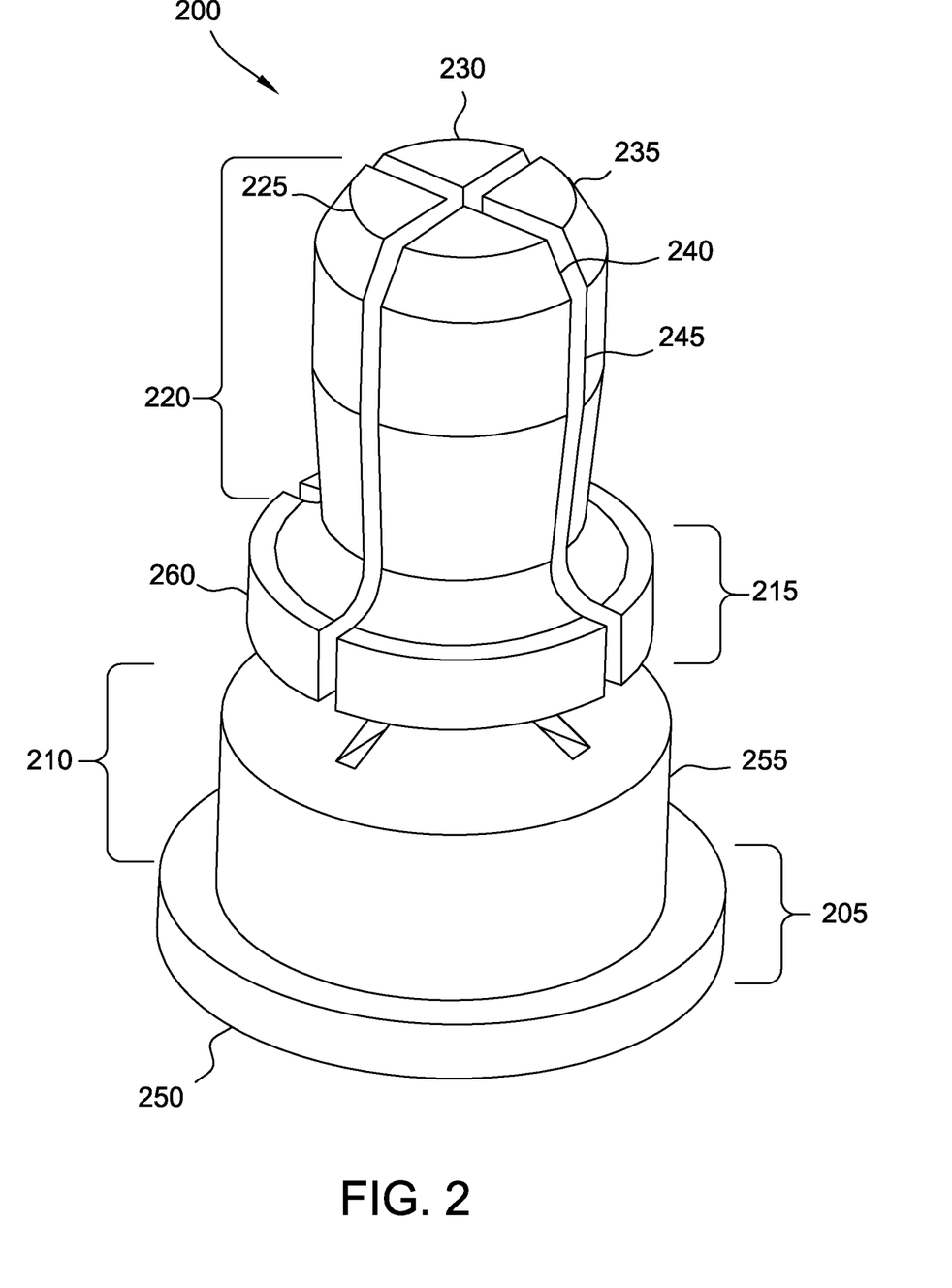
FIG. 2 illustrates a snap-fit connector for electrically coupling electronic components on a first circuit board to electronic components on a second circuit board according to an example.

FIG. 2 illustrates a snap-fit connector 200 for electrically coupling electronic components on a first circuit board to electronic components on a second circuit board according to an example. The snap-fit connector 200 may include a number of different sections. For example, the snap-fit connector 200 includes first section 205 (or a base section), a second section 210 (or a standoff section), a third section 215 (or a flanged section), and/or a fourth section 220 (or a pronged section).

Even though, four sections are shown and described, the snap-fit connector 200 may have any number of sections. Each section of the snap-fit connector 200 may serve a particular purpose when electrically and mechanically coupling the first circuit board to the second circuit board.

The first section 205 may include a base 250. The base 250 may be positioned on, or otherwise contact, a bottom surface of the first circuit board when the snap-fit connector 200 is inserted into a through-hole defined by the first circuit board. The base 250 may have a larger diameter than the through-hole to help ensure a stable connection between the first circuit board and the second circuit board when the circuit boards are coupled together.

The second section 210 may include a standoff 255. The standoff 255 is positioned within the through-hole defined by the first circuit board. The standoff 255 may have a diameter that substantially equivalent to a diameter of the through-hole. The standoff 255 may also be electrically coupled to a trace of an electronic component provided on the first circuit board.

The third section 215 includes a flange 260. The flange 260 may be used to support the second circuit board when the second circuit board is coupled to the snap-fit connector 200. For example, when the second circuit board is coupled to the snap-fit connector 200, the flange 260 may contact a bottom surface of the second circuit board. The flange 260 may define a space between the first circuit board and the second circuit board. For example, the flange 260 prevents the second circuit board from moving into the second section 210 of the snap-fit connector.

The fourth section 220 may include a number of prongs. For example, the fourth section may include a first prong 225, a second prong 230, a third prong 235 and a fourth prong 240. Each of the prongs may be defined by a channel 245. In an example, the channel 245 extends from a top surface of the fourth section 220 to at least a portion of the second section 210. The channel 245 may also extend across the diameter of the fourth section 220 and/or the third section 215. The channel 245 may enable the prongs to bend or more toward a longitudinal axis of the snap-fit connecter when a force is applied to the prongs. Likewise, the prongs may move back toward their original state/position when the force is removed.

In an example, the prongs enable the second circuit board to be removably coupled to the first circuit board. For example, when a through-hole defined by the second circuit board contacts the prongs and a downward force is applied, the prongs move or bend toward the longitudinal axis of the snap-fit connector 200. Once the second circuit board has been secured to the snap-fit connector 200, the prongs may be move back toward their original position thereby securing the second circuit board to the snap-fit connector 200 and the first circuit board.

In an example, each of the different sections of the snap-fit connector 200 may have different sizes, shapes and/or dimensions. In another example, some or all of the different sections of the snap-fit connector 200 may have the same or similar sizes, shapes and/or dimensions. For example, the first section 205, the second section 210, the third section 215 and the fourth section 220 may all have a cylindrical shape. However, a surface area (or a diameter) and/or a height of each of the first section 205, the second section 210, the third section 215 and the fourth section 220 may be different.

In an example, the first section 205 may have a diameter of approximately 2.5 millimeters (mm) and a height of approximately 0.25 mm. The second section 210 may have a height of approximately 1.42 mm and a diameter of approximately 2.0 mm. The third section 215 may have a height of approximately 0.3 mm and a diameter of approximately 1.8 mm. The fourth section 220 may have a height of approximately 1.85 mm and a diameter of 1.6 mm. Although specific dimensions are given, the dimensions of each section of the snap-fit connector 200 may change based on a number of factors.

These factors may include, but are not limited to: a thickness of the second circuit board that will be coupled to the fourth section 220 of the snap-fit connector 200; a diameter of a through-hole defined by the second circuit board; a desired offset or height between the first circuit board and the second circuit board; air circulation requirements and/or cooling requirements of one or more electronic components mounted on the first circuit board and/or the second circuit board; a height of the electronic components provided on the first circuit board and/or the second circuit board; a thickness of the first circuit board that will be coupled to the second section 210 of the snap-fit connector 200; and/or a diameter of a through-hole defined by the first circuit board.

In an example, the snap-fit connector 200 may be comprised of a conductive material. For example, the snap-fit connector 200 may be comprised of copper, metal, silver, or a combination of thereof. Although specific materials are mentioned, the snap-fit connector 200 may be comprised of any number of materials or a combination of materials.

In another example one or more sections of the snap-fit connector 200 may be comprised of a first material (e.g., a conductive material) while one or more other sections of the snap-fit connector 200 may be comprised of another material (e.g., a non-conductive material). For example, the second section 210 and the fourth section 220 of the snap-fit connector 200 may be comprised of conductive materials while the first section 205 and the second section 210 are comprised of a non-conductive material. In another example, the snap-fit connector 200 may include electrically conductive core or wire that extends through one or more of the sections. In yet another example, a core of the snap-fit connector 200 may be comprised of a non-conductive material while a surface of the snap-fit connector 200 is comprised of conductive material.

Accordingly, in an electronic assembly that includes a motherboard and a daughterboard, the snap-fit connector 200 may be used to electrically couple one or more electronic components on the daughterboard with one or more components on the motherboard.

Figure 3A:
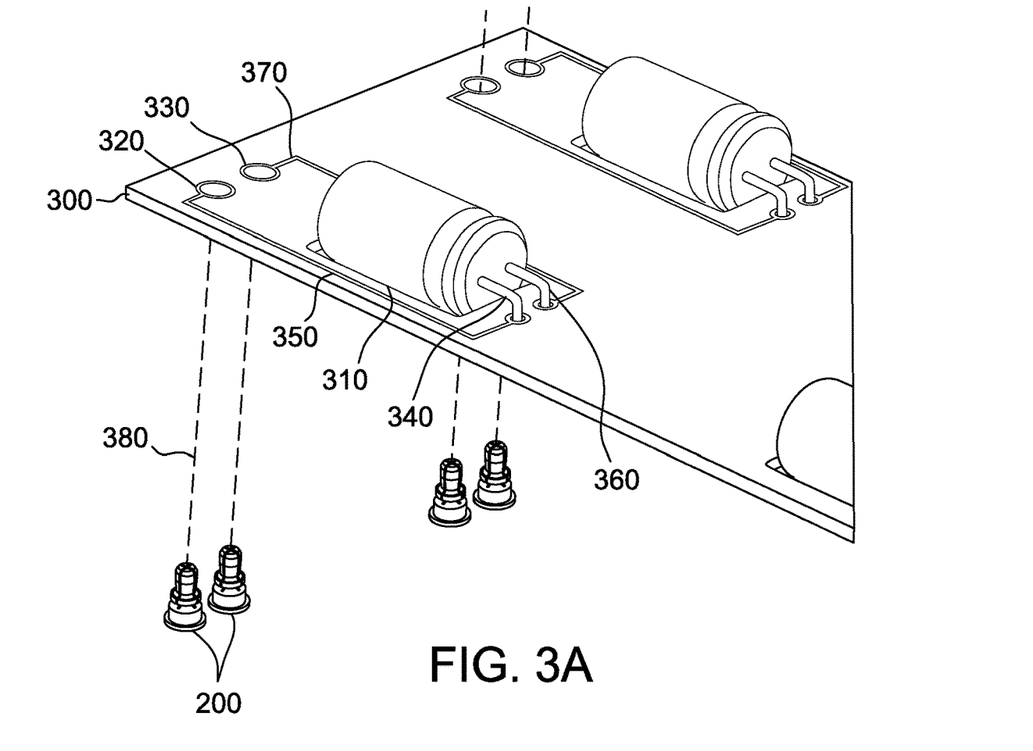
FIG. 3A illustrates how the snap-fit connector shown and described with respect to FIG. 2 may be inserted into one or more through-holes of a first circuit board according to an example.

FIG. 3A illustrates how the snap-fit connector 200 shown and described with respect to FIG. 2 may be inserted into one or more through-holes of a first circuit board 300 according to an example. In an example, the first circuit board 300 is a daughterboard that will form part of an electronic assembly. In an example, the electronic assembly may be a SSD or an eSSD, although other electronic assemblies are contemplated.

The first circuit board 300 may include a number of electronic components mounted on a surface and/or within one or more apertures or openings defined by the first circuit board 300. In the example shown in FIG. 3A, a number of capacitors 310 (e.g., electrolytic capacitors) are mounted on the surface of the first circuit board 300. Although capacitors 310 are specifically shown and described, any electronic component may be mounted on the surface of the first circuit board 300.

The first circuit board 300 also includes or otherwise defines a number of through-holes. For example, the first circuit board 300 includes a first through-hole 320 and a second through-hole 330. Additional through-holes may be provided in, or may otherwise be defined by, the first circuit board 300. Some through-holes may be used for electrical connections and mechanical connections while other through-holes may be used for mechanical connections.

In an example, each through-hole that is used for mechanical and electrical connections may be covered by, or otherwise include, a conductive material. For example, the first through-hole 320 and the second through-hole 330 may include copper plating, a copper layer, a copper ring, or otherwise be covered with copper (or another conductive material). Additionally, each through-hole may be electrically coupled to at least one electronic component of the first circuit board 300 using at least one trace.

For example, the first through-hole 320 is electrically coupled to a first lead 340 (e.g., a negative lead) of the capacitor 310 using a first trace 350. In an example, the first trace 350 is a copper trace. Likewise, the second through-hole 330 is electrically coupled to a second lead 360 (e.g., a positive lead) of the capacitor 310 using a second trace 370. In an example, the second trace 370 is also a copper trace.

In an example, a diameter of the first through-hole 320 and a diameter of the second through-hole 330 is equivalent to, or is substantially equivalent to, the diameter of the second section (e.g., the second section 210 (FIG. 2)) of the snap-fit connector 200. As such, when a first snap-fit connector 200 is inserted into the first through-hole 320 and a second snap-fit connector 200 is inserted into the second through-hole 330 (e.g., in the direction of the arrows 380), an electrical connection (or an electrical path) is established between the copper plating within each through-hole and the second section of each snap-fit connector 200.

In another example, the snap-fit connector 200, or one or more portions/sections (e.g., the second section 210) of the snap-fit connector 200, may be mounted directly to the surface of the first circuit board 300. For example, instead of using through-holes, one or more bond pads (e.g., copper pads, solder pads) or other connection points may be provided on the surface of the first circuit board 300. Each of the one or more bond pads may be coupled to one or more of the traces. A solder paste or other material may be provided on each of the one or more pads and snap-fit connectors 200 may be electrically coupled to respective pads and the traces using a reflow soldering process.

Figure 3B:
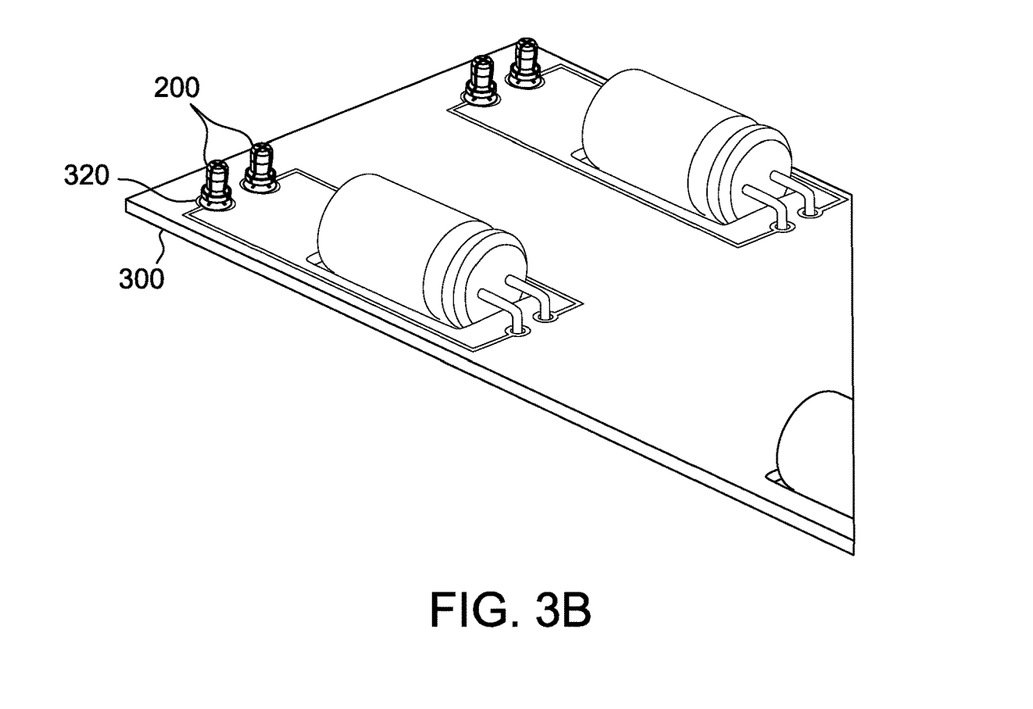
FIG. 3B illustrates the snap-fit connector being electrically coupled to the electronic components of the first circuit board according to an example.

FIG. 3B illustrates the snap-fit connector 200 being electrically coupled to the electronic components of the first circuit board 300 according to an example. As shown in FIG. 3B, when the first snap-fit connector 200 is inserted into the first through-hole 320 and the second snap-fit connector 200 is inserted into the second through-hole 330, all or substantially all, of the second section (e.g., the second section 210 (FIG. 2)) of each snap-fit connector 200 contacts the copper plating of the through-hole. In another example, a first portion of the second section of the snap-fit connector 200 may be coupled to the copper plating of the through-hole while a second portion of the second section of the snap-fit connector 200 may extend beyond the surface of the first circuit board 300.

An amount of the second portion of the second section of the snap-fit connecter that extends beyond the surface of the first circuit board 300 may be based on a number of factors. These factors include, but are not limited to: a desired offset or height between a second circuit board and the first circuit board 300; air circulation requirements and/or cooling requirements of the electronic components mounted on the first circuit board 300; and/or a height of the electronic components provided on the first circuit board 300.

Figure 4A:
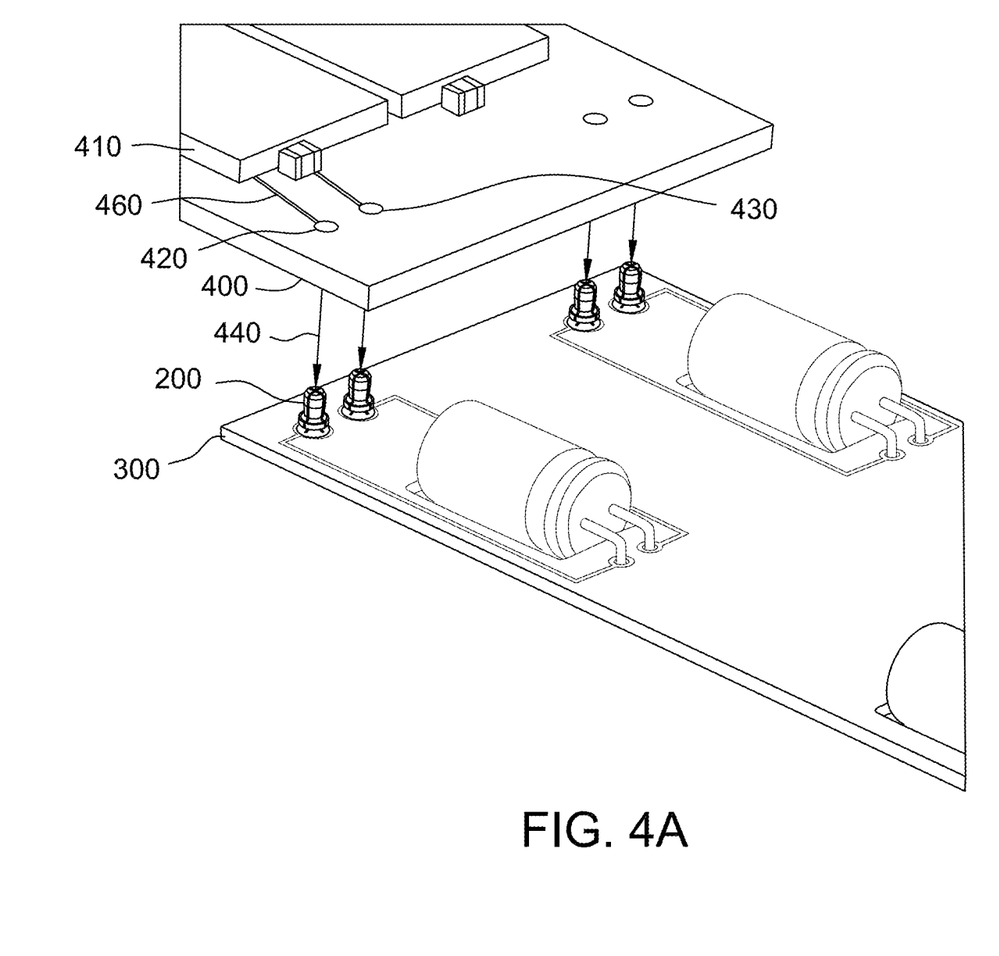
FIG. 4A illustrates how a second circuit board may be electrically coupled to the first circuit board shown and described with respect to FIG. 3A according to an example.

FIG. 4A illustrates how a second circuit board 400 may be electrically coupled to the first circuit board 300 shown and described with respect to FIG. 3A according to an example. In an example, the second circuit board 400 is a motherboard that will form part of an electronic assembly. In an example, the electronic assembly is a SSD or an eSSD although other electronic assemblies are contemplated.

The second circuit board 400 may include a number of electronic components mounted on a surface. In the example shown in FIG. 4A, the electronic components that are mounted to the surface of the second circuit board 400 are memory devices 410 (e.g., NAND memory devices). Although memory devices 410 are specifically described, any number of electronic components may be mounted on the surface of the second circuit board 400.

The second circuit board 400 also includes, or otherwise defines, a number of through-holes. For example, the second circuit board 400 includes a first through-hole 420 and a second through-hole 430. Additional through-holes may be provided in, or may otherwise be defined by, the second circuit board 400.

In an example, each through-hole may be covered by, or otherwise include, a conductive material. For example, the first through-hole 420 and the second through-hole 430 of the second circuit board 400 may include copper plating, a copper layer, a copper ring, or otherwise be covered with copper (or another conductive material). Additionally, each through-hole may be electrically coupled to (or an electrical pathway may be established between) at least one electronic component of the second circuit board 400 using at least one trace 460 (e.g., at least one copper trace).

In an example, a diameter of the first through-hole 420 and a diameter of the second through-hole 430 is equivalent to, or is substantially equivalent to, the diameter of the prongs on the fourth section (e.g., the fourth section 220

(FIG. 2)) of the snap-fit connector 200. However, the diameter of the first through-hole 420 and the diameter of the second through-hole 430 is less than a diameter of a flange (e.g., flange 260 (FIG. 2)) on a third section (e.g., the third section 215) of the snap-fit connector 200. As such, a portion of a bottom surface of the second circuit board 400 that surrounds each through-hole may contact a top surface of the flange of the snap-fit connector 200.

Thus, when the second circuit board 400 is mechanically and electrically coupled to the first circuit board 300 (e.g., the second circuit board 400 moves in the direction of the arrows 440), the prongs of the snap-fit connector 200 contract or bend toward a longitudinal axis of the snap-fit connector 200. This enables the first through-hole 420 and the second through-hole 430 on the second circuit board 400 to be pushed onto the prongs of the snap-fit connector 200. An electrical connection is established between the copper plating within each through-hole and the prongs of each snap-fit connector 200.

Figure 4B:
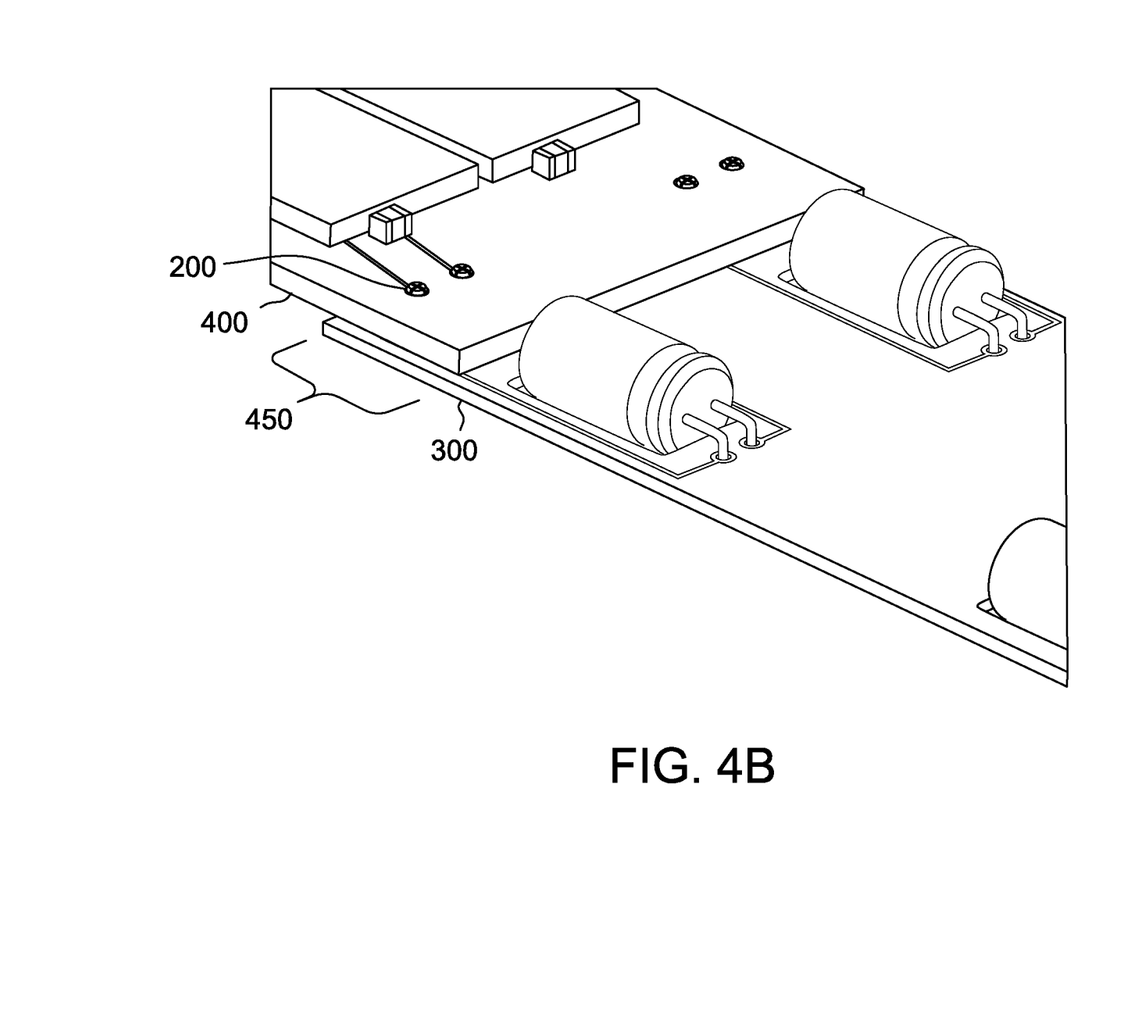
FIG. 4B illustrates the second circuit board being electrically coupled to the first circuit board using the snap-fit connector shown and described with respect to FIG. 2 according to an example.

FIG. 4B illustrates the second circuit board 400 being electrically coupled to the first circuit board 300 using the snap-fit connector 200 shown and described with respect to FIG. 2 according to an example.

In an example, the snap-fit connectors 200 provide a reliable electrical connection between the components of the first circuit board 300 and the second circuit board 400. Additionally, the snap-fit-connectors provide a reliable mechanical connection between the first circuit board 300 and the second circuit board 400. The reliable mechanical connection may be based on the design of the snap-fit connector and also on the position/location of the through-holes on each circuit board and the position/location of the snap-fit connectors.

The secure mechanical connection between the first circuit board 300 and the second circuit board 400 may help prevent the first circuit board 300 from slanting or moving with respect to the second circuit board 400. For example, the position/location of the through-holes on each circuit board enables a portion of the second circuit board 400 to overhang 450 or cover a portion of the first circuit board 300. The overhang 450 may reduce a length of the electrical assembly and also provide additional support for the first circuit board 300.

Figure 5A:
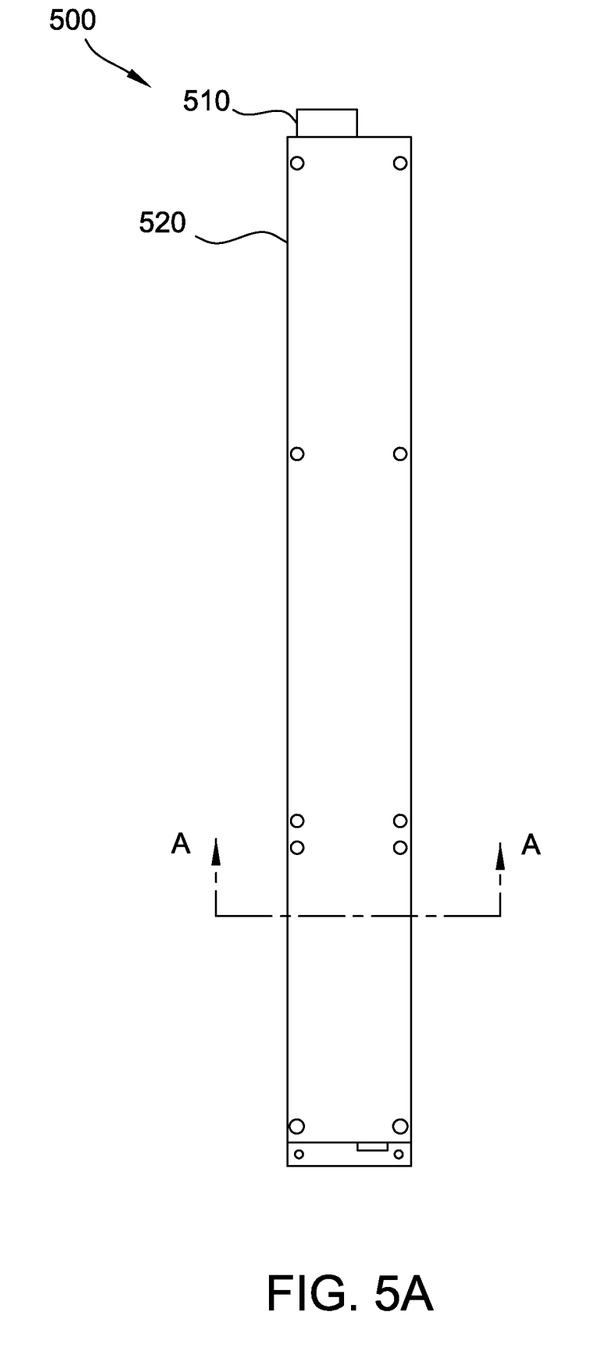
FIG. 5A illustrates an electronic assembly that includes a first circuit board and a second circuit board according to an example.

FIG. 5A illustrates an electronic assembly 500 that includes a first circuit board and a second circuit board according to an example. In an example, the electronic assembly 500 is a SSD or an eSSD. Accordingly, in this example, the electronic assembly 500 includes a connector 510. The connector 510 may be an edge connector that enables the electronic assembly 500 to be removably attached to a computing device. However, because the electronic assembly 500 may be removably attached to the computing device multiple times, it is important that the first circuit board and the second circuit board of the electronic assembly 500 are securely coupled together.

In an example, the electronic assembly 500 also includes a housing 520. The housing 520 may encase or surround the first circuit board, the second circuit board and the various electronic components that are provided on each circuit board. The housing 520 may also define a Z-height of the electronic assembly 500.

Figure 5B:
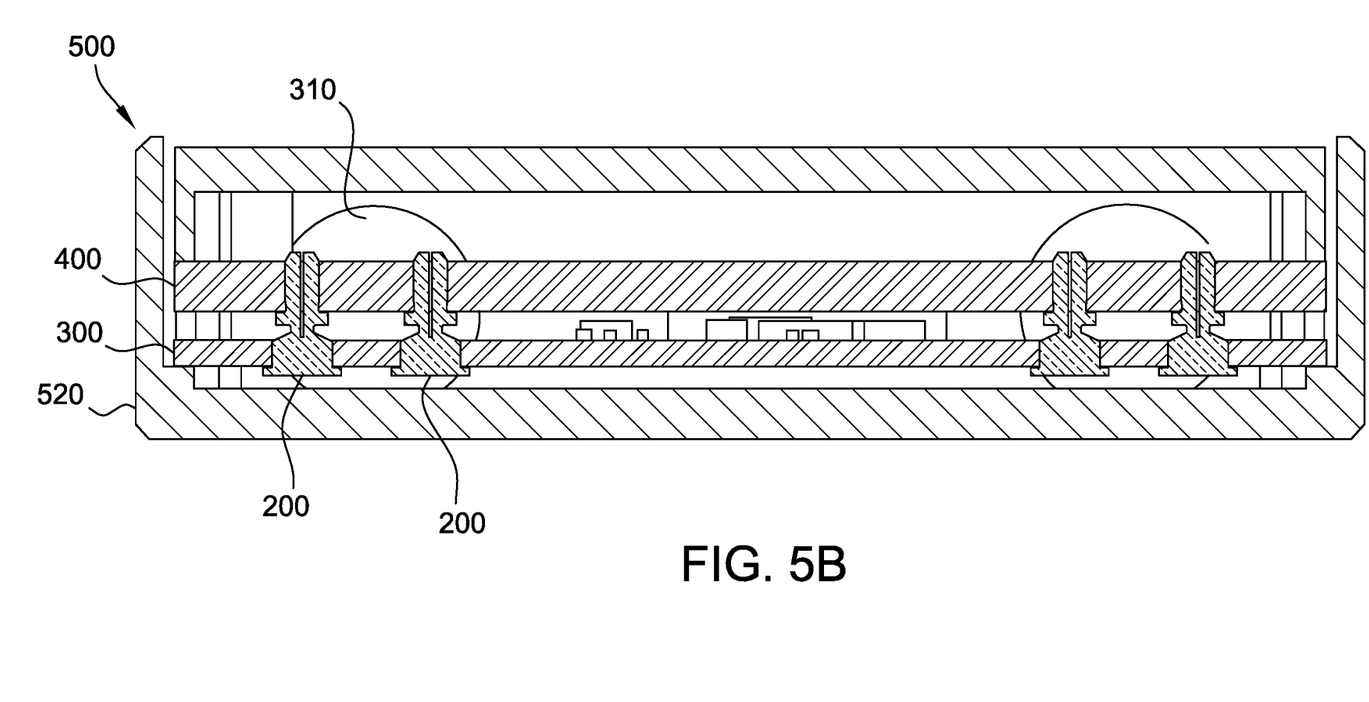
FIG. 5B is a cross-section view of the electronic assembly of FIG. 5A according to an example.

FIG. 5B is a cross-section view of the electronic assembly 500 of FIG. 5A according to an example. The cross-section view of the electronic assembly is taken along line A-A. The various components shown in the electronic assembly are similar to the various components shown and described with respect to FIG. 2-FIG. 4B.

As shown in FIG. 5B, the snap-fit connectors 200 have electrically and mechanically coupled the first circuit board 300 to the second circuit board 400. For example, a base of the snap-fit connector 200 is positioned on or below a bottom surface of the first circuit board 300. A standoff of the snap-fit connector 200 is received within a through-hole (e.g., through-hole 320 (FIG. 3A)) of the first circuit board 300. An electrical connection is established between a capacitor 310 of the first circuit board 300 and the standoff of the snap-fit connector 200 (e.g., using a trace).

Through-holes (e.g., through-hole 420 and/or through-hole 430 (FIG. 4A)) of the second circuit board 400 are coupled to the prongs of the snap-fit connector 200 and an electrical connection is established between the prongs and one or more electronic components on the second circuit board 400 such as previously described. When the second circuit board 400 is coupled to the prongs, a bottom surface of the second circuit board 400 contacts the flange (e.g., flange 260 (FIG. 2)) of the snap-fit connector 200.

Figure 6:
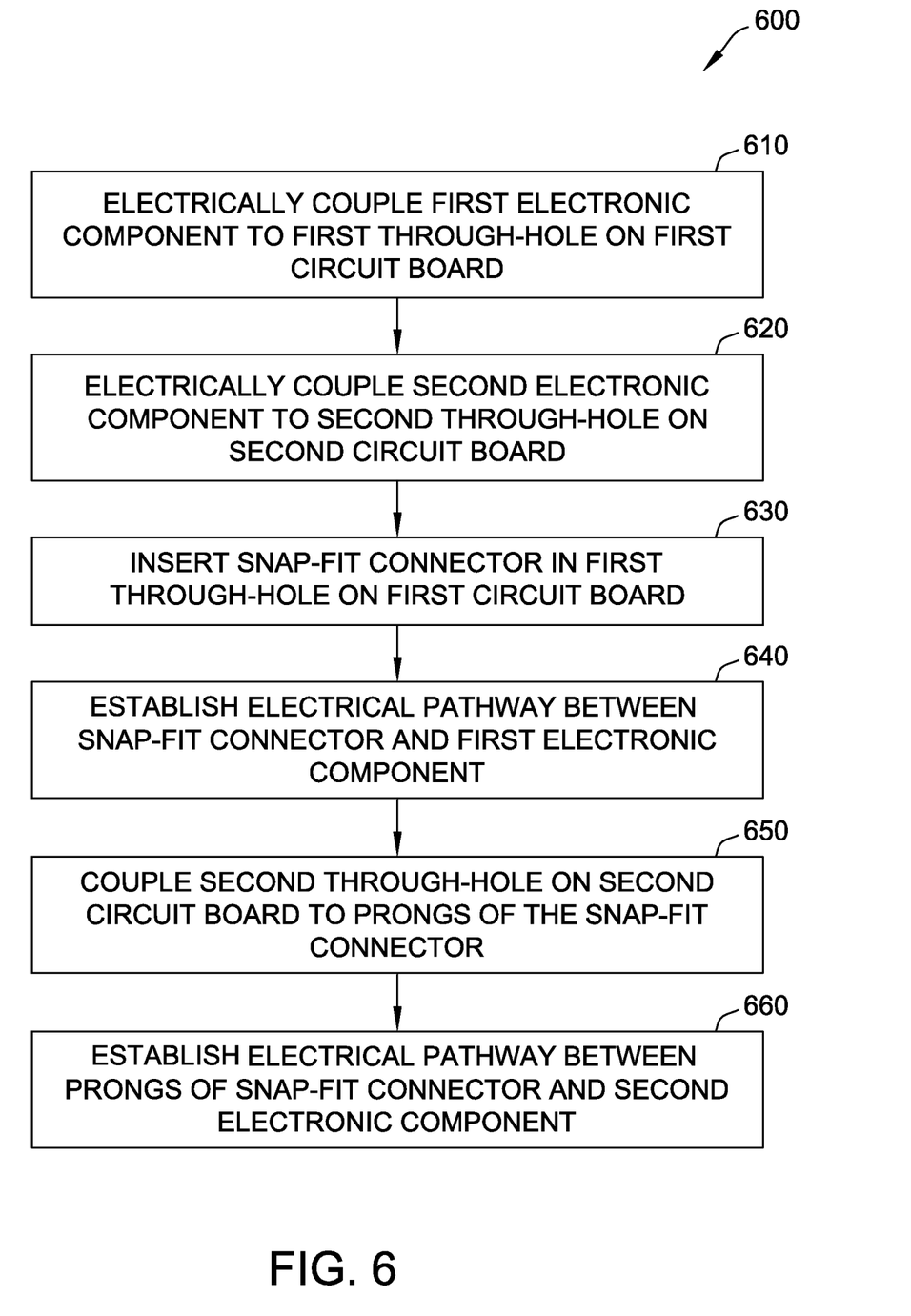
FIG. 6 illustrates a method for electrically and mechanically coupling a first circuit board to a second circuit board using a snap-fit connector according to an example.

FIG. 6 illustrates a method 600 for electrically and mechanically coupling a first circuit board to a second circuit board using a snap-fit connector according to an example. In an example, the snap-fit connector that is used to electrically and mechanically couple the first circuit board to the second circuit board may be the snap-fit connector 200 shown and described with respect to FIG. 2.

Method 600 begins when a first electronic component is electrically coupled (610) to a first through-hole on the first circuit board. In an example, the first electronic component is a capacitor. As such, a lead of the capacitor may be electrically coupled to the first through-hole using a copper trace. In some examples, the capacitor may have two leads, a positive lead and a negative lead. As such, the positive lead may be electrically connected to a first through-hole on the first circuit board and the negative lead may be electrically connected to a second through-hole on the first circuit board. In an example, the first through-hole (and the second through-hole) on the first circuit board may have a copper layer, copper plating, or some other conductive material within its perimeter. Although a through-hole is mentioned, a connection point (e.g., a bond pad) may be used in lieu of, or in addition to, the through-hole.

Additionally, a second electronic component is electrically coupled (620) to a second through-hole on the second circuit board. In an example, the second electronic component is a memory device (e.g., a NAND memory device). The second electronic component is electrically coupled to the second through-hole using a trace. In an example, the second electronic component may be electrically coupled to multiple through-holes that correspond with the first through-hole and the second through-hole on the first circuit board. As such, the second electronic component may be electrically coupled to both the positive lead and the negative lead of the capacitor when the first circuit board is electrically and mechanically coupled to the second circuit board. In an example, each through-hole on the second circuit board may have a copper layer, copper plating, or some other conductive material within its perimeter.

A snap-fit connector is inserted (630) in the first through-hole on the first circuit board. In an example, the snap-fit connector is comprised of a conductive material. As such, when snap-fit connector is inserted into the first though-hole, an electrical pathway may be established (640) between the snap-fit connector and the first electronic component. The electrical pathway may be used to establish an electrical connection between the various components on each circuit board with the electronic assembly that includes the first circuit board and the second circuit board is operational.

In another example, the snap-fit connector, or a section of the snap-fit connector, may be electrically coupled to a connection point (e.g., a bond pad). The snap-fit connector may be secured to the connection point using a soldering process (e.g., reflow soldering).

The second through-hole on the second printed circuit board may then be coupled (650) to the prongs of the snap-fit connector. As a result, an electrical pathway may be established (660) between the prongs of the snap-fit connector and the second electronic component.

Figure 7A:
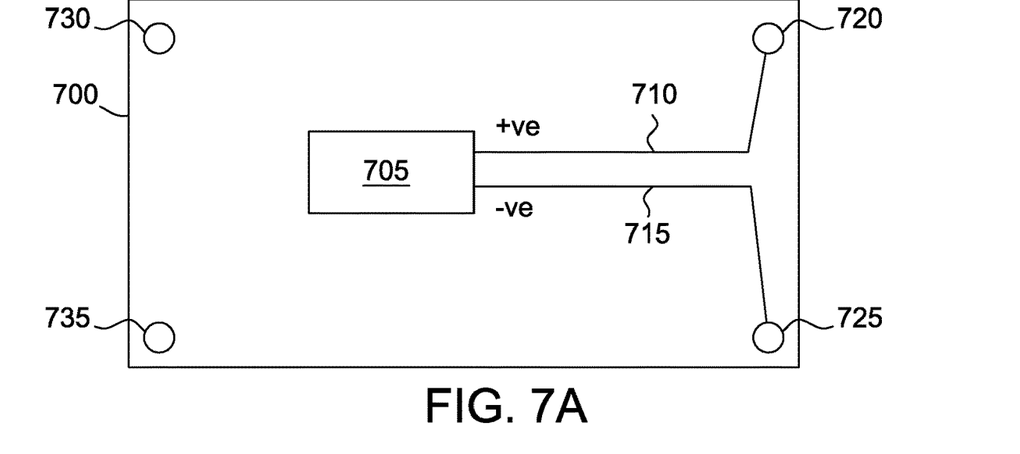
FIG. 7A illustrates a layout of a printed circuit board in which leads of a capacitor are electrically coupled to various connection points according to an example.

FIG. 7A illustrates a layout of a circuit board 700 in which leads of a capacitor 705 are electrically coupled to various connection points according to an example. The circuit board 700 may be similar to the first circuit board 300 shown and described with respect to FIG. 3.

In an example, the capacitor 705 has two leads, a positive lead (e.g., +ve) and a negative lead (e.g., −ve). Each lead of the capacitor 705 is electrically coupled to a respective trace associated with the circuit board 700. For example, the positive lead of the capacitor 705 is electrically coupled to a first trace 710 and the negative lead of the capacitor 705 is electrically coupled to a second trace 715.

Each of the traces may also be electrically coupled to different connection points. For example, the first trace 710 is electrically coupled to a first connection point 720 and the second trace 715 is electrically coupled to a second connection point 725. In this example, each of the connection points are conductive connection points. Accordingly, the conductive connection points may be aligned with corresponding conductive connection points (or though-holes) associated with another circuit board (e.g., the second circuit board 400 (FIG. 4A)) to which the circuit board 700 will be electrically coupled.

In an example, the first connection point 720 and/or the second connection point 725 are through-holes defined by the circuit board 700. In another example, the first connection point 720 and/or the second connection point 725 are bond pads. Accordingly, a snap-fit connector (e.g., the snap-fit connector 200 (FIG. 2)) may either be inserted within the through-hole or mounted on the bond pad such as previously described.

The circuit board 700 may also include non-conductive connection points 730. In an example, the non-conductive connection points 730 are not electrically coupled to the capacitor 705 or any other electronic component. The non-conductive connection points 730 may be through-holes defined by the circuit board and/or bond pads. A snap-fit connector may also be used with the-non-conductive connection points 730 to mechanically (but not electrically) couple the circuit board 700 to another circuit board.

Figure 7B:
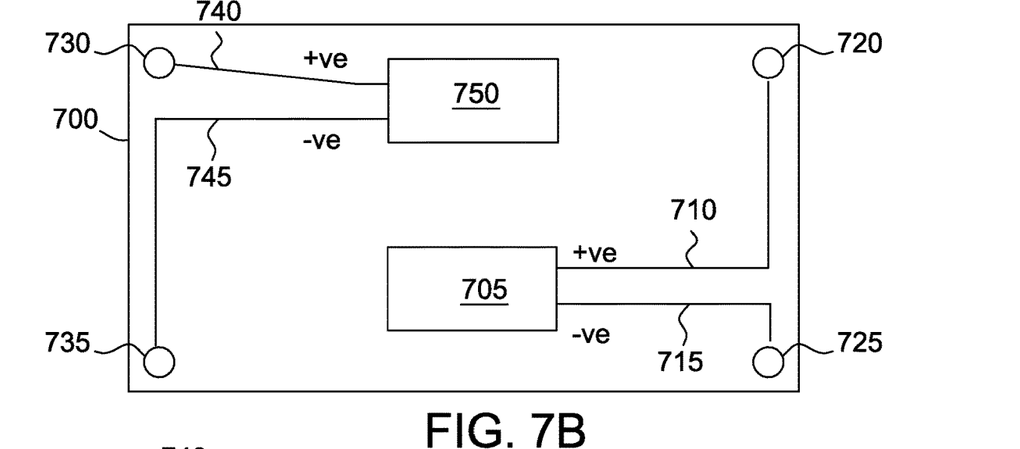
FIG. 7B illustrates another layout of a printed circuit board in which leads of multiple capacitors are electrically connected to various connection points according to an example.

FIG. 7B illustrates another layout of a circuit board 700 in which leads of multiple capacitors are electrically connected to various connection points according to an example. In this example, the circuit board 700 includes a first capacitor 705 and a second capacitor 750. Each capacitor has two leads and each of the leads are electrically coupled to respective traces associated with the circuit board 700.

For example, the positive lead of the first capacitor 705 is electrically coupled to a first trace 710 and the negative lead of the first capacitor 705 is electrically coupled to a second trace 715. Likewise, the positive lead of the second capacitor 750 is electrically coupled to a third trace 740 and the negative lead of the second capacitor 750 is electrically coupled to a fourth trace 745.

Each of the traces may also be electrically coupled to different connection points. For example, the first trace 710 is electrically coupled to a first connection point 720, the second trace 715 is electrically coupled to a second connection point 725, the third trace 740 is electrically coupled to a third connection point 730 and the fourth trace 745 is electrically coupled to a fourth connection point 735. In this example, each of the connection points are conductive connection points. Accordingly, the conductive connection points may be aligned with corresponding conductive connection points (or though-holes) associated with another circuit board (e.g., the second circuit board 400 (FIG. 4A)) to which the circuit board 700 will be electrically coupled.

In an example, the first connection point 720, the second connection point 725, the third connection point 730 and/or the fourth connection point 735 are through-holes defined by the circuit board 700. In another example, the first connection point 720, the second connection point 725, the third connection point 730 and/or the fourth connection point 735 are bond pads. Accordingly, a snap-fit connector may either be inserted within the through-hole or mounted on the bond pad such as previously described.

The circuit board 700 may also include non-conductive connection points. The non-conductive connection points may be through-holes defined by the circuit board 700. In another example, the non-conductive connection points may be bond pads. A snap-fit connector may also be used with the-non-conductive connection points to mechanically couple the circuit board 700 to another circuit board.

Figure 7C:
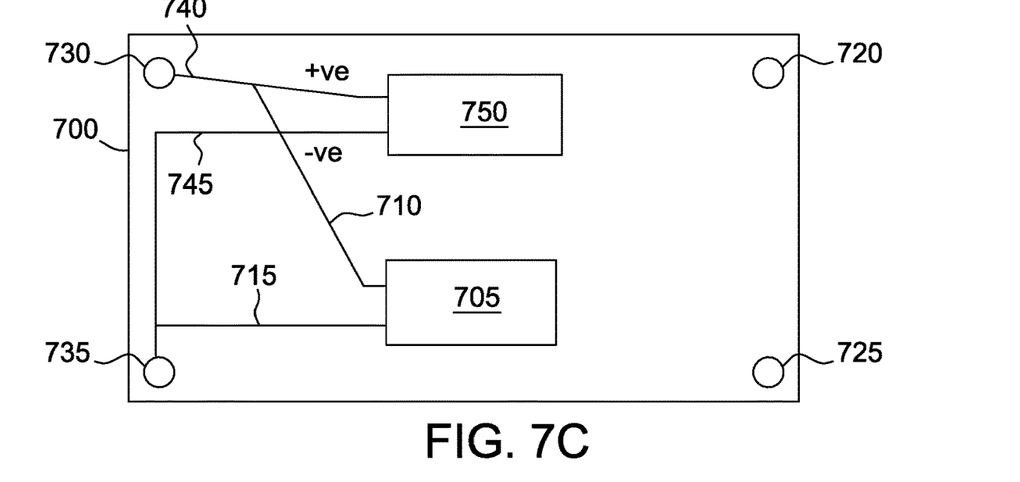
FIG. 7C illustrate another layout of a printed circuit board in which leads from different capacitors are electrically connected to the same connection points according to an example.

FIG. 7C illustrate another layout of a circuit board 700 in which leads from different capacitors are electrically connected to the same connection points according to an example. In this example, the circuit board 700 includes a first capacitor 705 and a second capacitor 750. Each capacitor has two leads and each of the leads are electrically coupled to respective traces associated with the circuit board 700.

For example, the positive lead of the first capacitor 705 is electrically coupled to a first trace 710 and the negative lead of the first capacitor 705 is electrically coupled to a second trace 715. Likewise, the positive lead of the second capacitor 750 is electrically coupled to a third trace 740 and the negative lead of the second capacitor 750 is electrically coupled to a fourth trace 745.

However, in this example, traces of the same type (e.g., positive traces and negative traces) are electrically coupled to the same connection points (or to each other). For example, the first trace 710 and the third trace 740 are electrically coupled to the third connection point 730 while the second trace 715 and the fourth trace 745 are electrically coupled to the fourth connection point 735.

In this example, the third connection point 730 and the fourth connection point 735 are conductive connection points while the first connection point 720 and the second connection point 725 are non-conductive connection points. Accordingly, the conductive connection points may be aligned with corresponding conductive connection points (or though-holes) associated with another circuit board (e.g., the second circuit board 400 (FIG. 4A)) to which the circuit board 700 will be electrically coupled.

In an example, the first connection point 720, the second connection point 725, the third connection point 730 and/or the fourth connection point 735 are through-holes defined by the circuit board 700. In another example, the first connection point 720, the second connection point 725, the third connection point 730 and/or the fourth connection point 735 are bond pads. Accordingly, a snap-fit connector may either be inserted within the through-hole or mounted on the bond pad such as previously described.

Based on the above, examples of the present disclosure describe an electronic assembly, comprising: a first circuit board; a first electronic component electrically coupled to a through-hole defined by the first circuit board; a second circuit board; a second electronic component electrically coupled to a through-hole defined by the second circuit board; and a snap-fit connector having a first portion provided within the through-hole defined by the first circuit board and a second portion provided within the through-hole defined by the second circuit board, the snap-fit connector establishing an electrical connection between the first electronic component and the second electronic component. In an example, the first circuit board further comprises non-conductive connection points. In an example, the non-conductive connection points on the first circuit board are aligned with non-conductive connection points on the second circuit board. In an example, the electronic assembly is a solid-state drive (SSD). In an example, the first electronic component is a capacitor; and the second electronic component is a memory device. In an example, the through-hole defined by the first circuit board is a first through-hole, and a first lead of the capacitor is electrically coupled to the first through-hole defined by the first circuit board and a second lead of the capacitor is electrically coupled to a second through-hole defined by the first circuit board. In an example, the through-hole defined by the second circuit board is a first through-hole, and the second circuit board further defines a second through-hole, the second through-hole defined by the second circuit board being electrically coupled to the second through-hole defined by the first circuit board with a second snap-fit connector.

Examples also describe An electronic assembly, comprising: a first circuit board; a first electronic component associated with the first circuit board; a first trace extending between the first electronic component and a connection point associated with the first circuit board; a second circuit board; a second electronic component associated with the second circuit board; a second trace extending between the second electronic component and a through-hole associated with the second circuit board; and a snap-fit connector having a first portion coupled to the connection point associated with the first circuit board and a second portion provided within the through-hole associated with the second circuit board, the first portion of the snap-fit connector and the second portion of the snap-fit connector establishing an electrical connection between the first electronic component associated with the first circuit board and the second electronic component associated with the second circuit board. In an example, the connection point associated with the first circuit board is a though-hole. In an example, the connection point associated with the first circuit board is a bond pad. In an example, the first portion of the snap-fit connector is electrically coupled to the bond pad using a reflow soldering process. In an example, the first circuit board further comprises non-conductive connection points. In an example, the electronic assembly is a solid-state drive (SSD). In an example, the first electronic component is a capacitor; and the second electronic component is a memory device. In an example, the connection point associated with the first circuit board is a first connection point and a first lead of the capacitor is electrically coupled to the first connection point and a second lead of the capacitor is electrically coupled to a second connection point associated with the first circuit board. In an example, the through-hole associated with the second circuit board is a first through-hole and a second through-hole is associated with the second circuit board, the second through-hole being electrically coupled to the second connection point associated with the first circuit board by a second snap-fit connector.

Examples also describe an electronic assembly, comprising: a first circuit board; a first electronic component associated with the first circuit board; a first electrical conductor means extending between the first electronic component and a first connection means associated with the first circuit board; a second circuit board; a second electronic component associated with the second circuit board; a second electrical conductor means extending between the second electronic component and a second connection means associated with the second circuit board; and a connector means having a first portion electrically coupled to the first connection means associated with the first circuit board and a snap-fit means electrically coupled to the second connection means associated with the second circuit board. In an example, the first connection means associated with the first circuit board is a through-hole. In an example, the first connection means associated with the first circuit board is a bond pad. In an example, the second connection means associated with the second circuit board is a through-hole.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. An electronic assembly, comprising:
   a first circuit board;
   a first electronic component electrically coupled to a through-hole defined by the first circuit board;
   a second circuit board;
   a second electronic component electrically coupled to a through-hole defined by the second circuit board; and
   a snap-fit connector having a first portion provided within the through-hole defined by the first circuit board and a second portion provided within the through-hole defined by the second circuit board, the snap-fit connector establishing an electrical connection between the first electronic component and the second electronic component.

2. The electronic assembly of claim 1, wherein the first circuit board further comprises non-conductive connection points.

3. The electronic assembly of claim 2, wherein the non-conductive connection points on the first circuit board are aligned with non-conductive connection points on the second circuit board.

4. The electronic assembly of claim 1, wherein the electronic assembly is a solid-state drive (SSD).

5. The electronic assembly of claim 1, wherein:
   the first electronic component is a capacitor; and
   the second electronic component is a memory device.

6. The electronic assembly of claim 5, wherein the through-hole defined by the first circuit board is a first through-hole, and wherein a first lead of the capacitor is electrically coupled to the first through-hole defined by the first circuit board and a second lead of the capacitor is electrically coupled to a second through-hole defined by the first circuit board.

7. The electronic assembly of claim 6, wherein the through-hole defined by the second circuit board is a first through-hole, and wherein the second circuit board further defines a second through-hole, the second through-hole defined by the second circuit board being electrically coupled to the second through-hole defined by the first circuit board with a second snap-fit connector.

8. An electronic assembly, comprising:
   a first circuit board;
   a first electronic component associated with the first circuit board;
   a first trace extending between the first electronic component and a connection point associated with the first circuit board;
   a second circuit board;
   a second electronic component associated with the second circuit board;
   a second trace extending between the second electronic component and a through-hole associated with the second circuit board; and
   a snap-fit connector having a first portion coupled to the connection point associated with the first circuit board and a second portion provided within the through-hole associated with the second circuit board, the first portion of the snap-fit connector and the second portion of the snap-fit connector establishing an electrical connection between the first electronic component associated with the first circuit board and the second electronic component associated with the second circuit board.

9. The electronic assembly of claim 8, wherein the connection point associated with the first circuit board is a though-hole.

10. The electronic assembly of claim 8, wherein the connection point associated with the first circuit board is a bond pad.

11. The electronic assembly of claim 8, wherein the first circuit board further comprises non-conductive connection points.

12. The electronic assembly of claim 8, wherein the electronic assembly is a solid-state drive (SSD).

13. The electronic assembly of claim 8, wherein:
    the first electronic component is a capacitor; and
    the second electronic component is a memory device.

14. The electronic assembly of claim 13, wherein the connection point associated with the first circuit board is a first connection point and wherein a first lead of the capacitor is electrically coupled to the first connection point and a second lead of the capacitor is electrically coupled to a second connection point associated with the first circuit board.

15. The electronic assembly of claim 14, wherein the through-hole associated with the second circuit board is a first through-hole and wherein a second through-hole is associated with the second circuit board, the second through-hole being electrically coupled to the second connection point associated with the first circuit board by a second snap-fit connector.

16. An electronic assembly, comprising:
    a first circuit board;
    a first electronic component associated with the first circuit board;
    a first electrical conductor means extending between the first electronic component and a first connection means associated with the first circuit board;
    a second circuit board;
    a second electronic component associated with the second circuit board;
    a second electrical conductor means extending between the second electronic component and a second connection means associated with the second circuit board; and
    a connector means having a first portion electrically coupled to the first connection means associated with the first circuit board and a snap-fit means electrically coupled to the second connection means associated with the second circuit board.

17. The electronic assembly of claim 16, wherein the first connection means associated with the first circuit board is a through-hole.

18. The electronic assembly of claim 16, wherein the first connection means associated with the first circuit board is a bond pad.

19. The electronic assembly of claim 16, wherein the second connection means associated with the second circuit board is a through-hole.

20. The electronic assembly of claim 16, wherein the snap-fit means has a plurality of prongs defined by a plurality of channels.

* * * * *